(12) United States Patent
Ploix

(10) Patent No.: US 6,395,999 B1
(45) Date of Patent: May 28, 2002

(54) ELECTRONIC POWER MODULE AND A METHOD OF MANUFACTURING SUCH A MODULE

(75) Inventor: Olivier Ploix, Saint Martin Boulogne (FR)

(73) Assignee: Sagem SA, Paris (FR)

( * ) Notice: Subject to any disclaimer, the term of this patent is extended or adjusted under 35 U.S.C. 154(b) by 0 days.

(21) Appl. No.: 09/889,931
(22) PCT Filed: Nov. 27, 2000
(86) PCT No.: PCT/FR00/03305
§ 371 (c)(1), (2), (4) Date: Sep. 12, 2001
(87) PCT Pub. No.: WO01/41519
PCT Pub. Date: Jun. 7, 2001

(30) Foreign Application Priority Data

Nov. 30, 1999 (FR) .............................. 99 15055

(51) Int. Cl.⁷ ............................ H05K 1/00; H05K 1/16
(52) U.S. Cl. .................... 174/260; 174/252; 174/255; 361/718; 361/760; 361/755; 29/832; 438/122; 257/691; 257/707; 257/713
(58) Field of Search ................... 174/260, 252, 174/255, 256, 258, 259, 261; 361/736, 737, 743, 760, 807, 809, 812, 637, 717, 718, 719, 720, 803, 775, 820; 29/832, 854, 829; 438/121, 122; 257/691, 713, 711, 720, 709, 707, 706

(56) References Cited

U.S. PATENT DOCUMENTS

| | | | | |
|---|---|---|---|---|
| 4,739,452 A | * | 4/1988 | Fukunaga | 361/399 |
| 4,756,081 A | * | 7/1988 | Penn | 29/852 |
| 5,539,618 A | * | 7/1996 | Wiesa et al. | 361/720 |
| 5,644,103 A | * | 7/1997 | Pullen et al. | 174/52.1 |
| 6,185,101 B1 | * | 2/2001 | Itabashi et al. | 361/704 |
| 6,292,368 B1 | * | 9/2001 | Pradel | 361/719 |
| 6,313,598 B1 | * | 11/2001 | Tamba et al. | 318/722 |

FOREIGN PATENT DOCUMENTS

| | | | |
|---|---|---|---|
| EP | 0489958 | * | 6/1992 |
| EP | 0667736 A | * | 8/1995 |
| FR | 2706730 A | * | 12/1994 |

OTHER PUBLICATIONS

"thin heat pipe for cooling component on printd circuit boards" IBM technical discl. bul. vol. 34, No. 7B, Dec. 1, 1991, pp. 321–322. (disclosed by the applicant).*

* cited by examiner

Primary Examiner—Kainand Cuneo
Assistant Examiner—I B Patel
(74) Attorney, Agent, or Firm—Larson & Taylor PLC

(57) ABSTRACT

The module including an aluminum-based metal substrate (10) and at least one copper-based bar (12) constituting an equipotential connection which is fixed to the substrate via an insulating layer. A power component (16) is in direct contact with the bar via a surface area that is smaller than the area of the insulating layer. A printed circuit card (18) mounted on the bar(s) and projecting therefrom carries low heat-dissipation components of the module.

7 Claims, 1 Drawing Sheet

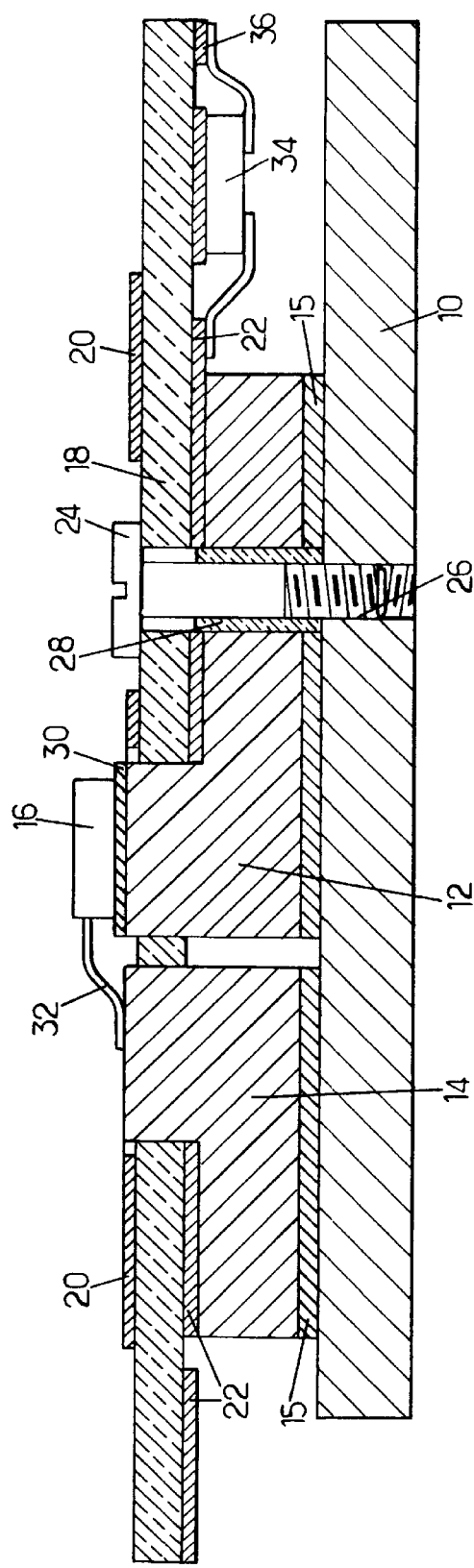

ELECTRONIC POWER MODULE AND A METHOD OF MANUFACTURING SUCH A MODULE

BACKGROUND OF THE INVENTION

The present invention relates to electronic modules including an aluminum-based metal substrate carrying at least one power component such as a transistor. Such a module is particularly, although not exclusively, applicable to the automotive industry where electronic circuits are used to power engine elements and are placed in a high temperature environment, which makes it more difficult to remove the heat dissipated by the component(s).

A known assembly technique consists in mounting the transistor (or any other heat-dissipated element) on the relative thin aluminum substrate (a few millimeters thick) via a thin insulating layer. That solution area does not exceed the area of the component, presents a large amount of thermal resistance. The thermal inertia of the aluminum substrate is relatively small and does not make it possible to absorb fast variation in the power dissipated by the component without significant temperature variation.

SUMMARY OF THE INVENTION

It is an object of the invention to provide a module that satisfies practical requirements better than previously known modules. It is a more specific object to decrease the thermal resistance of the heat-evacuating circuit and to accommodate fast peaks of dissipated heat power.

To this end, the invention provides in particular a module comprising an aluminum-based metal substrate; at least one bar of copper-based material constituting an equipotential connection and fixed to the substrate via an insulating layer; at least one power component in direct contact with the bar via a surface area that is smaller than that of the insulating layer; and a printed circuit card mounted on the bar(s), projecting therefrom, and carrying those components of the module which have a low heat-dissipation.

In addition to the bar(s) carrying at least one power component, the module will typically include one or more bars for carrying power currents and having the outlets of the power component(s) connected thereto.

The bars can be pressed strongly against the substrate by rivets or screws bearing against the card, which in turn bears against the bars, the ends of the rivets or screws being engaged in the substrate. If the screws or rivets are not of electrically-insulating material, they should be separated from the bar(s) by insulating sleeves.

In general, the printed circuit card carries conductive tracks on both of its sides, thus making it possible to provide connections with the bar(s) and enabling components to be mounted on its side facing the substrate where the card extends beyond the bars.

The card can have openings for passing projections of the bar carrying a power component or a coupling for such a component, thereby facilitating assembly.

The invention also provides a method of manufacturing a module of the above-defined kind, comprising the following steps:

soldering one or more power components on at least one bar of copper-based metal;

coating a larger face of the bar remote from the component(s) in a layer of heat-setting insulating material;

mounting a printed circuit card fitted with components that dissipate little heat compared with that dissipated by the power components on the bars;

clamping the resulting assembly against an aluminum-based metal substrate by means of screws or rivets; and making junctions between the outlets of the power components and corresponding bars.

In practice, it is generally necessary to use bars having a minimum cross-section of about 10 square millimeters ($mm^2$). The insulating material coating the larger faces of the bars can be of a type which, on first heating, flows to fill the pores in the faces between which it is located.

The above characteristics and others will appear more clearly on reading the following description of a particular embodiment, given by way of non-limiting example. The description refers to the sole accompanying FIGURE which is a description section view through a fraction of a module.

The module shown in FIG. 1 comprises a substrate 10 of aluminum-based metal which often constitutes one of the walls of a tank for circulating a cooling fluid. This fluid can also be a working fluid, e.g. oil of an electrical pump controlled by the module. One or more copper bars are mounted on the substrate 10 via an insulating layer 15. The figure shows two bars 12 and 14 placed parallel to each other. One of the bars 12 is for receiving a power component 16 (or a plurality of power components operating in parallel). The module also has a printed circuit card 18 printed on both sides to present copper contact areas such as 20 and 22. In the embodiment shown, each bar has a projecting portion which engages in a corresponding opening in the printed circuit card 18.

Any electrical connections that might be necessary between the contact areas 22 of the card and the bars are provided by pressing the card against the bars. In the embodiment shown, the means for pressing the card 18, the bars 12 & 14, and the substrate 10 against one another comprise screws 24. The head of each screw bears against a non-metal coated portion of the card 18, and its shank engages in a tapped hole 26 in the substrate 10. If the screw 24 is made of conductive material, it should be surrounded by an insulating ring 28 where it passes through the bar. Instead of using screws, it is possible to use rivets.

Given that each bar 12 is separated from the substrate 10 by an insulating layer 15, the power components can be fixed on the bars via conductive solder 13, having thermal conductivity that is much greater than the thermal conductivity of an insulating layer. The low conductivity of the layer 15 is compensated by the fact that it presents a surface area that is much larger than that which would be occupied by an insulating layer placed immediately beneath the component 16.

The power currents passing between the components 16 and the remainder of the module can be transferred by means of the bars 14 which have the connection tabs 32 of the components soldered thereto. The bars 14 have a large current-carrying cross-section, so they present low resistive losses, and they also evacuate the heat generated in the bar and in the components via a path whose thermal resistance is low.

In addition to carrying power components, the printed circuit card can carry components that dissipate little heat that are mounted in conventional manner on the side of the card that is remote from the substrate and/or on the side of the card that faces the substrate. The figure shows one such component 34 fixed on the side facing the substrate. The figure shows such a component 34 fixed on the side facing towards the substrate and connected to conventional metallized tracks 36.

In general, a substrate is used that is a few millimeters thick, and copper bars 12 and 14 are used having a cross-section of at least 10 mm². The printed circuit card can be a conventional card of fiber-reinforced plastics material carrying copper tracks and contact areas that are several tens of microns thick.

Various other embodiments are possible. In particular, it is not essential for the bars to have projections that pass through he printed circuit card 18. The module can carry a plurality of cards, with at least some of them co-operating with bars.

One possible method of manufacturing a module of the invention is described below merely by way of example. Some of the operations described can be replaced by others, and the order of the operations can often be changed.

The various subassemblies constituting the module are prepared separately. The components, such as 34, that are not for mounting on bars are connected and fixed to the card, e.g. by reflow soldering. Each bar receives a layer of insulating material. In general a hot-setting material is used which is deposited as a thin layer on the bottom face of each bar and is then polymerized. Materials of this kind exist which have the advantage of slightly creeping so as to fill the pores in the face or faces with which they are in contact while they are heated. One option consists in performing such polymerization on the bars while they are separate. The power components are fixed on respective bars. A stack is built up comprising the substrate, the bars, and the fitted card(s) and contact pressure is exerted between the various component elements by means of screws or rivets. Finally, the necessary electrical connections are made between the power components and the bars that are for carrying power currents.

What is claimed is:

1. A module comprising:

an aluminum-based substrate;

at least one bar of copper-based material constituting an equipotential connection and fixed to the substrate via an insulating layer;

at least one power component located in direct contact with the bar via a surface area that is smaller than a surface area of the insulating layer; and a printed circuit card mounted on said bar or bars, projecting beyond said bar or bars, and carrying low heat-dissipation components of the module.

2. A module according to claim 1, further comprising at least one additional bar sized for carrying power current and connected to outputs of the power component.

3. A module according to claim 1, further comprising rivets or screws for pressing said bars against the substrate, said rivets or screws bearing against the card which bears against the bars, and having ends engaged in the substrate.

4. A module according to claim 2, further comprising rivets or screws for pressing said bars and said additional bars against the substrate, said rivets or screws bearing against the card which bears against the bars, and having ends engaged in the substrate.

5. A module according to claim 1, wherein the printed circuit card carries conductive tracks on two major sides thereof for providing connections with the bar or bars and for mounting components on that of said major sides facing towards the substrate where the card projects beyond the bars.

6. A module according to claim 1, characterized in that the card has openings for passing projections from the bar or each of said bars carrying a power component or providing a connection for such a component.

7. A method of manufacturing a module comprising:

an aluminum-based metal substrate;

at least one bar of copper-based metal constituting an equipotential connection and fixed to the substrate via an insulating layer;

at least one power component located in direct contact with the bar via a surface area that is smaller than a surface area of the insulating layer; and a printed circuit card mounted on said bar or bars, projecting beyond said bar or bars, and carrying low heat-dissipation components of the module, the method comprising the steps of:

soldering at least one power component on a major face of at least one respective said bar;

coating a major face of the bar opposite to the major face which received the power component in a layer of heat-setting insulating material;

mounting a printed circuit card fitted with components that dissipate little heat compared with that dissipated by the power components on the bars;

clamping the obtained assembly against an aluminum-based metal substrate by means of screws or rivets; and making junctions between outputs of the power components and an associated one of said bar or bars.

\* \* \* \* \*